United States Patent [19]
Funado

[11] Patent Number: 5,537,107
[45] Date of Patent: Jul. 16, 1996

[54] REMOTE CONTROL UNIT FOR VIDEO APPARATUS

[75] Inventor: Shigeto Funado, Tokyo, Japan

[73] Assignee: Sony Corporation, Tokyo, Japan

[21] Appl. No.: 455,595

[22] Filed: May 31, 1995

Related U.S. Application Data

[63] Continuation of Ser. No. 212,642, Mar. 14, 1994, abandoned, which is a continuation of Ser. No. 825,263, Jan. 24, 1992, abandoned.

[30] Foreign Application Priority Data

Jan. 29, 1991 [JP] Japan ..................... 3-008862

[51] Int. Cl.$^6$ ..................... G08C 17/02; H04B 10/24; H04L 17/00
[52] U.S. Cl. ............... 340/825.72; 340/825.69; 348/734; 359/146; 341/176
[58] Field of Search ............. 340/825.69, 825.72; 359/142, 143, 144, 145, 146, 152, 154, 169; 341/176; 348/734, 733

[56] References Cited

U.S. PATENT DOCUMENTS

| | | | |
|---|---|---|---|
| 4,746,919 | 5/1988 | Reitmeier | 340/825.54 |
| 4,763,291 | 8/1988 | Schwaber | 340/711 |
| 4,907,082 | 3/1990 | Richards | 358/194.1 |
| 4,965,557 | 10/1990 | Schepers et al. | 348/734 |
| 5,003,396 | 3/1991 | Kang | 359/146 |

*Primary Examiner*—Eric Coleman
*Assistant Examiner*—Mark H. Rinehart
*Attorney, Agent, or Firm*—Jay H. Maioli

[57] ABSTRACT

A remote control unit for an external video apparatus such as a video camera and a VTR includes an infrared signal receiving section for receiving a video signal as a infrared signal from the video apparatus. A video image depending upon the video signal is displayed on a LCD display together with display information necessary for a remote control in a LCD display. An operator can easily carry out the necessary remote control operation through a key matrix, confirming the result of the operation upon reviewing the video image in the LCD display. The operator's key matrix operation is put into a microcomputer which, in turn, produces a control information for the video apparatus and transmits it to the video apparatus through an encoder and an infrared signal transmitting section. The above-mentioned display information is produced by the microcomputer and input through a character generator to the LCD display. Employing the LCD display increases the amount of information to be displayed, thereby making the remote control unit multi-functional.

2 Claims, 1 Drawing Sheet

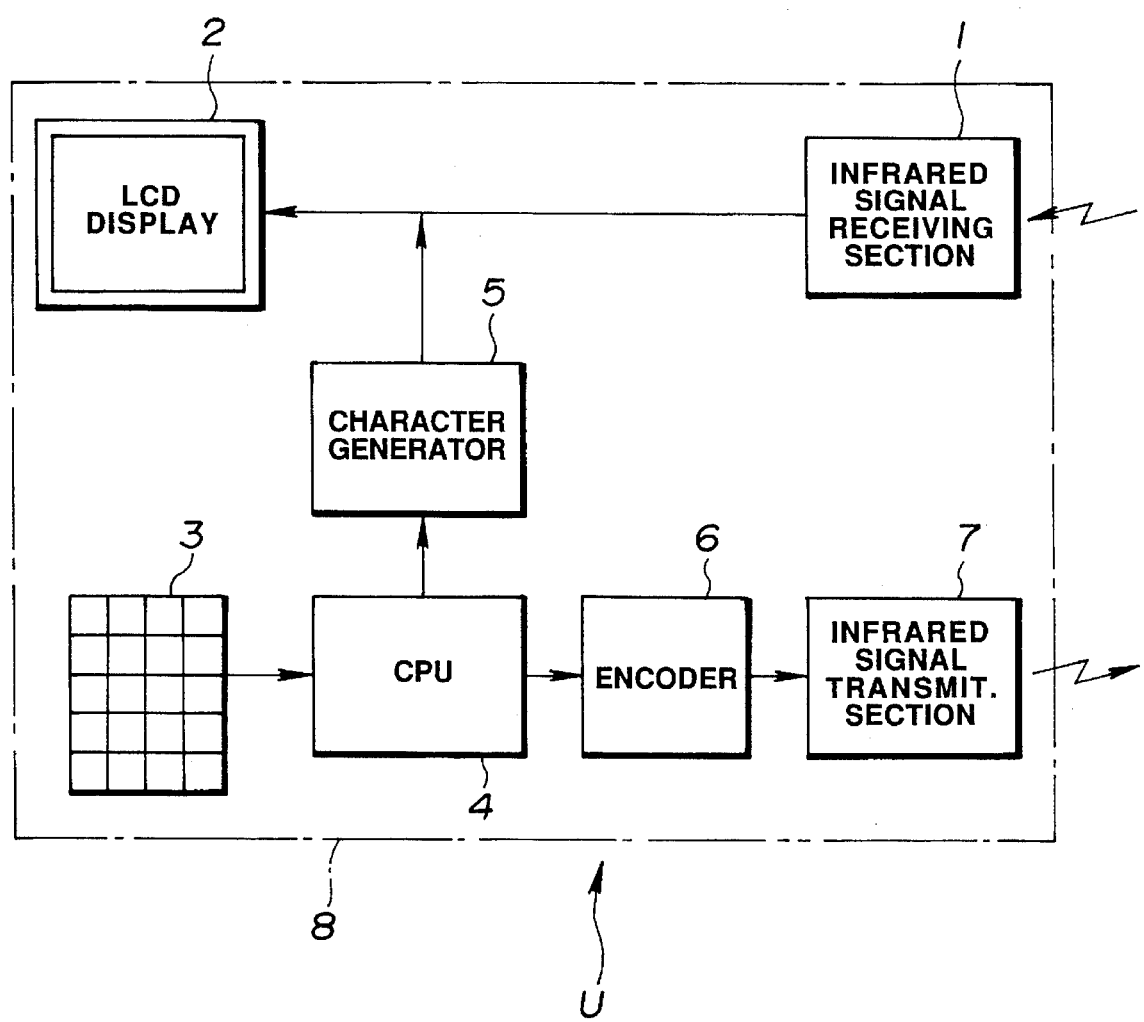

REMOTE CONTROL UNIT FOR VIDEO APPARATUS

This is a continuation of application Ser. No. 08/212,642, filed Mar. 14, 1994, now abandoned, which was a continuation of application Ser. No. 07/825,263, filed Jan. 24, 1992, now abandoned.

BACKGROUND OF THE INVENTION

1. Field of the Invention

This invention relates to improvements in a remote control unit for an external video apparatus such as a video camera, a VTR (video-tape recorder) or the like, and more particularly to such a remote control unit which has a large information processing capacity and is highly multi-functional.

2. Description of the Prior Art

Hitherto a variety of remote control units have been extensively used to remotely control in hand an external objective video apparatus such as a video camera or a VTR. Of these remote control units, there is one which is facilitated in operation by displaying various characters and graphic information for each operational mode.

However, difficulties have been encountered in such a conventional remote control unit as set forth below: For example, in case of one for a video camera, an operator cannot see an image or picture at the view finder of the video camera and therefore it is difficult to make a sufficient control operation without looking through the view finder of the video camera. Additionally, in case of one for a VTR, the remote control operation for video-tape editing or the like must be made upon displaying a video image on the screen of a television receiver for the purpose of monitoring. These are considerably troublesome in practical use.

SUMMARY OF THE INVENTION

An object of the present invention is to provide an improved remote control unit for an external video apparatus, which largely facilitates the remote control operation of an external video apparatus for handling video images or pictures, such as a video camera, a VTR or the like, while making possible increasing its information processing capacity and a highly multi-functional operation.

Another object of the present invention is to provide an improved remote control unit for an external video apparatus, provided with a monitoring display for displaying the video images or pictures depending upon video signals from an external video apparatus.

A remote control unit of the present invention is for an external video apparatus and comprised of a signal receiving section for receiving a video signal from the external video apparatus. A video image depending upon the video signal is displayed in a display section. Additionally, a video image depending upon display information necessary for a remote control operation is displayed in the display section. A key input for the remote control operation is made by an operator through the keys of an operation section. A signal transmitting section is provided to transmit a signal representing control information for the remote control operation, to the external video apparatus. Additionally, a control section is provided to input the key input and to produce the displaying information and the control information.

Accordingly, the remote control unit is provided with the video signal receiving section and the video image displaying section at which the video image depending upon the video signal is displayed in addition to the display information necessary for the remote control operation of the external video apparatus. Therefore, the operator can monitor, in hand, the video image as a result of the remote control operation, thereby facilitating the remote control operation for the video image. Additionally, the provision of the video image displaying section makes possible increasing the display information and therefore enabling the remote control unit to be multi-functional. Furthermore, concerning the remote control operation for the external video apparatus for handling video images, such as a VTR, a video camera or the like, confirmation of the video images before and after the remote control operation is made easy and therefore a sufficient and suitable operation for the video apparatus can be made.

BRIEF DESCRIPTION OF THE DRAWING

The single FIGURE (FIG. 1) is a block diagram of an embodiment of a remote control unit in accordance with the present invention.

DETAILED DESCRIPTION OF THE INVENTION

Referring now to FIG. 1, an embodiment of a remote control unit according to the present invention is illustrated by the reference character U. The remote control unit U is suitable for controlling an external video apparatus (not shown) such as a video camera, a VTR (video-tape recorder) or the like. In this embodiment, the remote control unit U is functionally connected with the external video apparatus in a wireless fashion, such as by radio and therefore is of the wireless type. The remote control unit U is comprised of an infrared signal receiving section 1 which is adapted to receive video signals as infrared signals from the external video apparatus. It will be understood that the remote control unit U may also be of the wired type wherein the signal receiving section (1) is electrically connected to the external video apparatus over (electrically conductive) wires. The signal receiving section 1 is electrically connected to a LCD (liquid crystal display) 2 which has a size of about 4 inches and is adapted to receive the video signal from the infrared signal receiving section 1 and display thereon video images (or pictures) and display information necessary for a remote control operation of the external video apparatus.

A key matrix 3 is provided so that the remote control operation for the external video apparatus is carried out through the keys thereof by an operator (not shown) thereby to make key inputs for the remote control operation. The key matrix 3 is electrically connected to a CPU (central processing unit) or microcomputer which is adapted to input the key inputs from the key matrix 3 upon making a key scanning and to produce the above-mentioned displaying information and control informations for the remote control operation. The CPU 4 is electrically connected to a character generator 5 which is adapted to convert the displaying informations from the CPU 4 into characters to be superimposed on the video image of the LCD display 2.

An encoder 6 is electrically connected to the CPU 4 and adapted to encode the control informations from the CPU 4 and to output the encoded control informations to an infrared signal transmitting section 7 electrically connected to the encoder 6. The infrared signal transmitting section 7 is adapted to convert the encoded control signals from the encoder 6 into infrared signals and transmit them to the external apparatus such as the VTR or the like under. It will be understood that the signal transmitting section 7 may be electrically connected with the external video apparatus on (electrically conductive) wires in case that the remote control unit U is the wired type.

In this embodiment, the infrared signal receiving section 1, the LCD display 2, the key matrix 3, the CPU 4, the character generator 5, the encoder 6 and the infrared signal transmitting section 7 are all fixedly mounted or disposed on a one-piece or integral support base 8 thereby to constitute a single unit.

The manner of operation of the remote control unit U will be discussed hereinafter.

When the infrared video signals are input to the infrared signal receiving section 1 from the external video apparatus such as the VTR or the like, they are successively displayed on the screen of the LCD display 2. Concurrently with this, the CPU 4 produces the displaying information such as operational mode information, a variety of setting information and the like which are to be displayed as necessary for the remote control operation. The thus produced display information are input through the character generator 5 to the LCD display 2 and superimposed on the video images on the screen of the LCD display 2.

Then, the operator of the remote control unit U operates the keys of the key matrix 3 to make the key inputs for the remote control operation upon seeing the video image and the displaying informations displayed on the screen of the LCD display 2, confirming the result of the operator's key input operation. Then, the CPU 4 inputs the key inputs under the key scanning or the like and produces the control information for the external video apparatus such as the VTR or the like. This control information is encoded by the encoder 6 and input to the infrared signal transmitting section 7 which in turn transmits the control information as infrared signals to the external video apparatus such as the VTR or the like.

Thus, according to this embodiment, the video image can be displayed together with the display information on the display screen of the remote control unit U. In case that the objective external video apparatus is the VTR, the video image can be monitored in hand without displaying it on the screen of a television receiver (not shown), so that the remote control operation for editing a recorded video tape (not shown) is considerably facilitated. In case that the objective external video apparatus is the video camera, the video image in the view finder of the camera can be monitored, i.e., changing in video image as a result of, for example, moving a mounting of the video camera can be monitored thereby making possible the remote control or the like of the video camera.

Additionally, employing the LCD display 2 makes possible a variety of display manners, increasing the the amount of the displaying informations and the control informations. This realizes a multi-functional remote control operation for the external video apparatus. For example, in case of applying the remote control unit U to accomplish an automatic adjustment for a video projector, the position and moving amount of a cursor or the like can be appointed upon displaying the video image of the video camera thereby facilitating commanding the correction or the like of the display on the display screen.

While the remote control unit U of this embodiment has been shown and described as being of the wireless type so that receiving the video signals and transmitting the control information signals are made without using wires, it will be understood that it may be of the wired type so that the same receiving and the transmitting are made on (electrically conductive) wires, in which electrical signals are used in place of the infrared signals.

Although the video image or picture displayed on the display screen has been shown and described as being formed only depending upon the video signals from the external video apparatus, it will be appreciated that the video image may be formed depending upon informations from a memory or the like disposed in the remote control unit U, in which displaying the video image is carried out upon an image processing using the CPU 4 or the like.

A plurality of kinds of video signals may be input to the remote control unit U respectively from a plurality of external apparatuses, in which these video signals are, for example, image-edited by the CPU 4 and displayed in a so-called picture-in-picture display manner in which a video image is formed in another video image. As appreciated from the above, various changes and modifications may be possible in the remote control unit U of the present invention, according various applications.

What is claimed is:

1. A remote control unit for controlling an external video camera apparatus, comprising:

a support base;

a wireless video signal receiver mounted on said support base for receiving a video signal from the external video camera apparatus, said video signal being transmitted in the infrared region of the electromagnetic spectrum;

a liquid crystal display mounted on said support base and connected to said video signal receiver for displaying a video image depending upon said video signal and for displaying character information corresponding to a remote control operation of the external video camera apparatus superimposed on said video image;

a keypad mounted on said support base through which a key input for the remote control operation is made by an operator of the remote control unit;

a wireless control signal transmitter mounted on said support base for transmitting a control signal to the external video camera apparatus representing control information for the remote control operation, said control signal being transmitted in the infrared region of the electromagnetic spectrum;

a controller mounted on said support base and connected to said keypad and to said control signal transmitter for receiving said key input from said keypad and producing display information corresponding to said key input and for producing said control information fed to said signal transmitter; and a character generator mounted on said support base and connected to said controller for converting said display information from said controller into said character information fed to said display, so that said display displays said character information superimposed on said video image.

2. A remote control unit as claimed in claim 1, further comprising an encoder adapter to encode said control information from said controller, in which said signal transmitter includes means for transmitting said encoded control information.

* * * * *